United States Patent
Sato et al.

(10) Patent No.: US 6,324,111 B1
(45) Date of Patent: Nov. 27, 2001

(54) SEMICONDUCTOR MEMORY

(75) Inventors: Yasuharu Sato; Shinya Fujioka, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/561,217

(22) Filed: Apr. 28, 2000

(30) Foreign Application Priority Data

Jul. 19, 1999 (JP) .................................................. 11-204323

(51) Int. Cl.[7] ....................................................... G11C 7/02
(52) U.S. Cl. .......................... 365/207; 365/149; 365/208
(58) Field of Search .................................. 365/205, 207, 365/189.09, 226, 208, 149

(56) References Cited

U.S. PATENT DOCUMENTS

| | | | |
|---|---|---|---|
| 5,446,694 | * 8/1995 | Tanaka et al. | 365/203 |
| 5,646,880 | * 7/1997 | Yuh | 365/149 |
| 5,646,900 | 7/1997 | Tsukude et al. . | |
| 5,657,278 | * 8/1997 | Lee | 365/189.09 |
| 5,822,262 | * 10/1998 | Hashimoto et al. | 365/207 |
| 5,970,010 | * 10/1999 | Hira et al. | 365/226 |
| 6,031,779 | 2/2000 | Takahashi et al. . | |
| 6,157,586 | * 12/2000 | Ooishi | 365/205 |
| 6,212,110 | * 4/2001 | Sakamoto et al. | 365/190 |

FOREIGN PATENT DOCUMENTS

| | | |
|---|---|---|
| 2-018784 | 1/1990 | (JP) . |
| 5-062467 | 3/1993 | (JP) . |
| 8-255480 | 10/1996 | (JP) . |

OTHER PUBLICATIONS

WO 98/56004, Dec. 10, 1998.

* cited by examiner

*Primary Examiner*—David Nelms
*Assistant Examiner*—Gene N. Auduong
(74) *Attorney, Agent, or Firm*—Arent Fox Kintner Plotkin & Kahn, PLLC

(57) ABSTRACT

A semiconductor memory includes p-type MOS transistors (11) dispersed in one-to-one correspondence with sense amplifiers ($4_{-1}$–$4_{-n}$) to activate their corresponding sense amplifiers, and a p-type MOS transistor (12) to activate the sense amplifiers ($4_{-1}$–$4_{-n}$). After the p-type MOS transistors (11) are overdriven by an external voltage (VCC) higher than a memory stored voltage, the p-type MOS transistor (12) is driven by an internal step-down voltage (VII) that is the memory stored voltage. This increases the driving capability per sense amplifier in comparison with a conventional method and further increases the speed of sense operation in comparison with a simple overdriving method.

17 Claims, 8 Drawing Sheets

F I G. 7
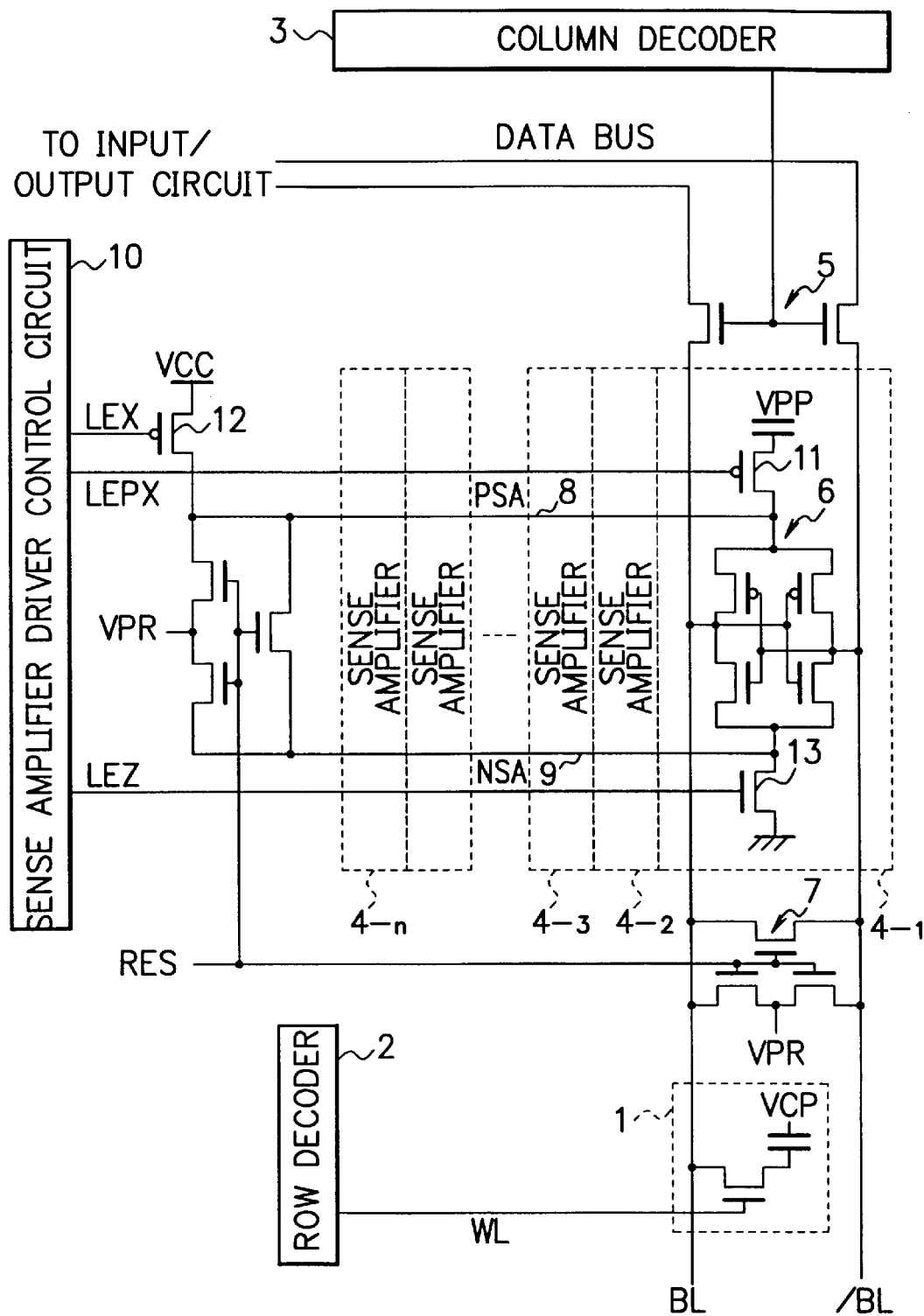

SEMICONDUCTOR MEMORY

BACKGROUND OF THE INVENTION

1. Field of the Invention

The present invention relates to a semiconductor memory and, more particularly, to a semiconductor memory suitably used as a memory, such as a DRAM, having sense amplifiers for receiving data of a memory cell corresponding to a selected word line via a bit line and amplifying the received data.

2. Description of the Related Art

Recently, in semiconductor memories represented by DRAMs with increasing capacity, an internal step-down voltage lower than an external power-supply voltage is often used as a bit line voltage determined by the stored electric charge of a memory cell, for the purpose of reducing power consumption.

In a sense amplifier which rewrites a memory cell of a DRAM by amplifying output microcharge from the memory cell, however, the driving capability lowers and the rewrite time increases as the voltage lowers. This increases the cycle time and access time of the DRAM. To shorten this rewrite time, an overdrive type sense amplifier has been proposed as disclosed in Japanese Patent Laid-Open No. 2-18784 or 5-62467.

FIG. 1 is a diagrammatic view showing a partial configuration of a DRAM using the conventional overdrive type sense amplifier. In this DRAM, a large number of memory cell arrays are formed in a matrix manner on a chip, and sense amplifiers are included in one-to-one correspondence with the respective memory cell arrays.

Referring to FIG. 1, a memory cell 1 includes one MOS transistor and one capacitive element. Although only one memory cell 1 is shown in FIG. 1, in practice a large number of memory cells 1 are arrayed in a matrix manner. The gate of the transistor of each memory cell 1 is connected to a word line WL corresponding to this memory cell 1. The drain of this transistor is connected to a bit line BL corresponding to the memory cell 1.

A row decoder 2 decodes a row address signal and activates a word line WL connected to a memory cell 1 to be accessed, from among word lines WL formed in one-to-one correspondence with rows of the memory cell arrays formed in a matrix manner. A column decoder 3 decodes a column address signal and selects a pair of bit lines BL and /BL connected to a memory cell 1 to be accessed, from among pairs of bit lines BL and /BL formed in one-to-one correspondence with columns of the memory cell arrays formed in a matrix manner. The column decoder 3 turns a corresponding column gate 5 on and connects the selected pair of bit lines BL and /BL to a data bus.

Reference numerals $4_{-1}$ to $4_{-n}$ denote flip-flop sense amplifiers formed in one-to-one correspondence with the pairs of bit lines BL and /BL. Each sense amplifier amplifies a differential voltage generated on a pair of bit lines BL and /BL in accordance with electric charge stored in the capacitive element of the memory cell 1 accessed in data read. The column gate 5 described above is a column selecting transistor for connecting a pair of bit lines BL and /BL corresponding to an output signal from the column decoder 3 to the data bus. A bit line precharge/equalize circuit 7 precharges the input/output nodes of a pair of bit lines BL and /BL and a flip-flop to a precharge voltage VPR (typically VII/2).

Reference numeral 8 denotes a signal line to which high-potential terminals of flip-flops 6 of the sense amplifiers $4_{-1}$ to $4_{-n}$ are connected together. A signal on this signal line 8 is represented by PSA. Reference numeral 9 denotes a signal line to which low-potential terminals of the flip-flops 6 are connected together. A signal on this signal line 9 is represented by NSA. Each flip-flop 6 starts being activated when the signals PSA and NSA change to high and low levels, respectively, and these levels reach certain levels.

Reference numeral 11 denotes a p-type MOS transistor connected between the signal line 8 and the power supply of an external voltage VCC; 12, a p-type MOS transistor connected between the signal line 8 and the power supply of an internal step-down voltage VII; and 13, an n-type MOS transistor connected between the signal line 9 and the power supply of ground voltage. These transistors 11 to 13 constitute a driving circuit (sense amplifier driver) of the sense amplifiers $4_{-1}$ to $4_{-n}$. A sense amplifier driver control circuit 10 controls ON/OFF of the three transistors 11 to 13.

In the above arrangement, to write data in a memory cell 1, the row decoder 2 decodes a row address signal and activates a word line WL connected to the memory cell 1 in which the data is to be stored. Also, the column decoder 3 decodes a column address signal and outputs a column selecting signal to the gate of the corresponding column selecting transistor 5, such that a pair of bit lines BL and /BL connected to the memory cell 1 in which the data is to be stored are connected to the data bus.

One of the bit lines BL and /BL changes to high level and the other changes to low level in accordance with the data to be written, and the corresponding electric charge is stored in the capacitive element of the accessed memory cell 1. When the activation of the word line WL by the row decoder 2 is stopped after that, the transistor of the accessed memory 1 is turned off, and the charge stored in the capacitive element is kept stored. Consequently, the data is stored in the memory cell 1.

To read out data from a memory cell 1, the row decoder 2 decodes a row address signal and activates a word line WL connected to the memory cell 1 from which the data is to be read out. Consequently, a differential voltage corresponding to the charge amount stored in the capacitive element of the memory cell 1 to be accessed is generated on a pair of bit lines BL and /BL.

When the transistors 11 to 13 are turned on at the respective appropriate timings after that, the signals PSA and NSA start changing to high and low levels, respectively. When these signals PSA and NSA reach certain levels, the flip-flop 6 of the sense amplifier starts being activated and operates in a direction in which the differential voltage on the pair of bit lines BL and /BL increases.

The column decoder 3 decodes a column address signal and outputs a column selecting signal to the corresponding column selecting transistor 5, thereby connecting the pair of bit lines BL and BL, connected to the memory cell from which the data is to be read out, to the data bus. Consequently, the data read from the memory cell 1 onto the bit lines BL and /BL is amplified and output via the data bus, or rewritten in the memory cell 1.

In the overdrive type sense amplifier, when the flip-flops 6 of the sense amplifiers $4_{-1}$ to $4_{-n}$ are to be driven by turning the transistors 11 to 13 on or off, the p-type MOS transistor 11 and the n-type MOS transistor 13 are first turned on to supply the external voltage VCC higher than the internal step-down voltage VII as a memory stored voltage to the signal line 8.

When the voltage level of a pair of bit lines BL and /BL reaches the memory stored voltage, the p-type MOS transistor 11 is turned off, the p-type MOS transistor 12 is turned on, and a voltage at the memory stored voltage level is supplied to the signal line 8. In this way, the time of rewrite to the memory cell 1 is shortened by driving the pair of bit lines BL and /BL by using the external voltage VCC higher than the internal step-down voltage VII in the initial stages of driving.

Recently, a fast cycle memory such as an FCRAM (Fast Cycle Random Access Memory) described in Japanese Patent Application No. 9-145406 has been proposed, and higher rewrite speed is being increasingly demanded. The conventional method is capable of achieving high speed to some extent by overdriving but inapplicable to a memory that operates at very high cycle time.

SUMMARY OF THE INVENTION

It is an object of the present invention to shorten the amplification time of a sense amplifier and increase the speed of cycle time of a memory.

To achieve the above object, in a semiconductor memory of the present invention, first sense amplifier driving circuits driven by a first power-supply voltage are dispersed for sense amplifiers, which are overdriven by the first sense amplifier driving circuits thus dispersed.

By this arrangement, the speed of sense operation can be increased by overdriving the sense amplifiers by the first power-supply voltage higher than a memory stored voltage (step-down voltage). Besides, the dispersed driving circuits can increase the overdriving capability per sense amplifier in comparison with conventional memories. Consequently, the speed of sense operation can be further increased in comparison with a simple overdriving method. Therefore, it is possible to shorten greatly the amplification time of the sense amplifier and to increase the speed of cycle time of the semiconductor memory.

BRIEF DESCRIPTION OF THE DRAWINGS

FIGS. 5A and 5B are charts showing operating waveforms during restore operation, in which FIG. 5A shows conventional operating waveforms and FIG. 5B shows operating waveforms of the first embodiment;

FIG. 7 is a circuit diagram showing a partial configuration of a semiconductor memory according to the third embodiment of the present invention.

DETAILED DESCRIPTION OF THE PREFERRED EMBODIMENTS

Hereinafter, embodiments of the present invention will be described with reference to drawings.

Figure 1:
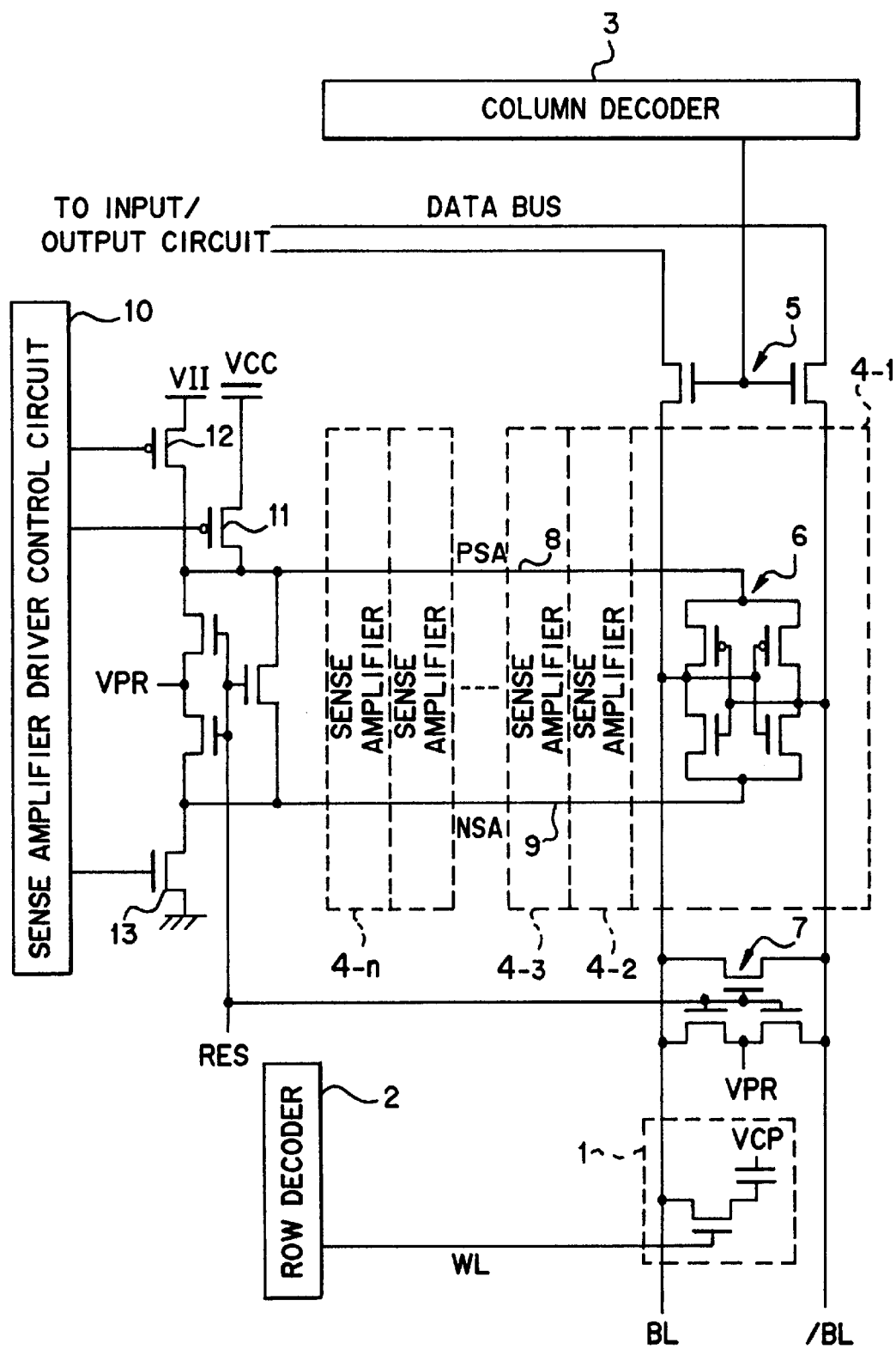
FIG. 1 is a circuit diagram showing a partial configuration of a conventional semiconductor memory.
Figure 2:
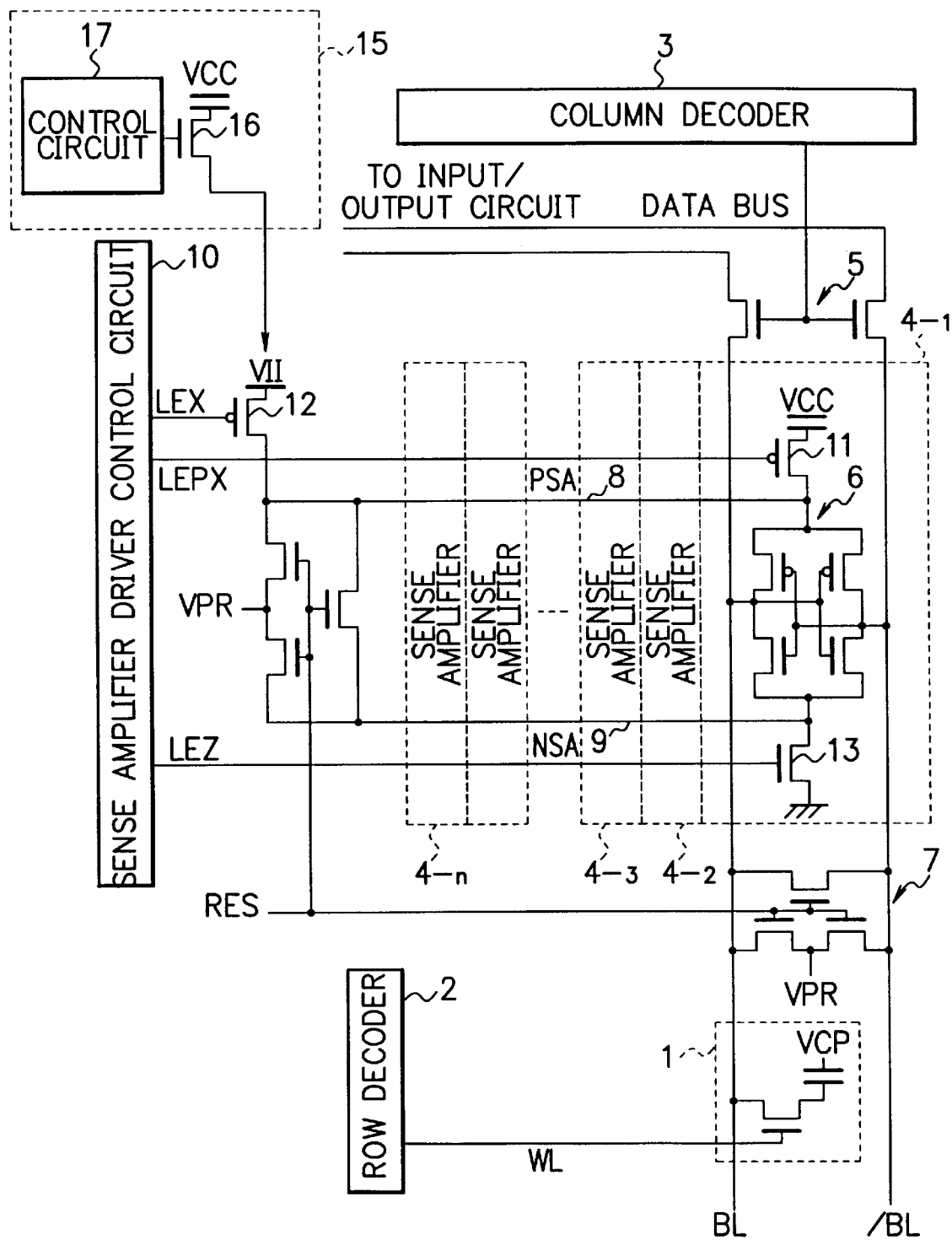
FIG. 2 is a circuit diagram showing a partial configuration of a semiconductor memory according to the first embodiment of the present invention.

FIG. 2 is a diagrammatic view showing a partial configuration of a semiconductor memory according to the first embodiment of the present invention. The same reference numerals as in FIG. 1 denote the same parts as in FIG. 1. The semiconductor memory of this embodiment can apply to a DRAM, e.g., an FCRAM.

In this embodiment, as shown in FIG. 2, p-type MOS transistors 11 (first sense amplifier driving circuits), which are sense amplifier drivers for driving flip-flops 6 of sense amplifiers $4_{-1}$ to $4_{-n}$, and n-type MOS transistors 13 are provided in one-to-one correspondence with the respective sense amplifiers $4_{-1}$ to $4_{-n}$. The p-type MOS transistors 11 and the n-type MOS transistors 13 control the driver driving times of the individual sense amplifiers in accordance with driving signals LEPX and LEZ supplied from a sense amplifier driver control circuit 10 to the gates of these transistors.

Another p-type MOS transistor 12 (a second sense amplifier driving circuit) constituting the sense amplifier driver is shared by the sense amplifiers $4_{-1}$ to $4_{-n}$, as in FIG. 1. This p-type MOS transistor 12 controls the driver driving times of the sense amplifiers $4_{-1}$ to $4_{-n}$ in accordance with a driving signal LEX supplied from the sense amplifier driver control circuit 10 to the gate of the transistor. An internal step-down voltage VII supplied to the source of this p-type MOS transistor 12 is generated by an internal step-down circuit 15 and is a voltage (e.g., 2.0 V) lower than an external voltage VCC (e.g., 2.5 V).

The internal step-down circuit 15 includes a transistor 16 whose source is connected to the power supply of the external voltage VCC and a control circuit 17 for controlling the conductance of this transistor 16. In this internal step-down circuit 15, the control circuit 17 controls the gate potential of the transistor 16 to generate the internal step-down voltage VII from the external voltage VCC.

To read out data from a memory cell 1, a row decoder 2 decodes a row address signal and activates a word line WL connected to the memory cell 1 from which the data is to be read out. Consequently, electric charge stored in a capacitive element of the memory cell 1 to be accessed is read out onto a pair of bit lines BL and /BL. To amplify the readout charge by the sense amplifiers, the sense amplifier driver control circuit 10 drives the transistors 11 to 13 as the sense amplifier driver.

First, the p-type MOS transistors 11 and the n-type MOS transistors 13 are turned on to drive the sense amplifiers by the external voltage VCC higher than the internal step-down voltage VII that is a memory stored voltage. When the level of the amplified voltage on the bit lines BL and /BL reaches the internal step-down voltage VII, the p-type MOS transistors 11 are turned off, the p-type MOS transistor 12 is turned on, and the driving voltage of the sense amplifiers is clamped to the internal step-down voltage VII.

In this embodiment as described above, each of the sense amplifiers $4_{-1}$ to $4_{-n}$ is overdriven by the external voltage VCC, so a rewrite (restore) operation can be performed at high speed. Also, the p-type MOS transistors 11 are dispersed in one-to-one correspondence with the respective sense amplifiers $4_{-1}$ to $4_{-n}$. Therefore, in comparison with the conventional method by which the sense amplifiers $4_{-1}$ to $4_{-n}$ are driven by one p-type MOS transistor 11, the driving capability per sense amplifier can be increased. This can further increase the speed of the restore operation in comparison with a simple overdriving method.

Figure 3:
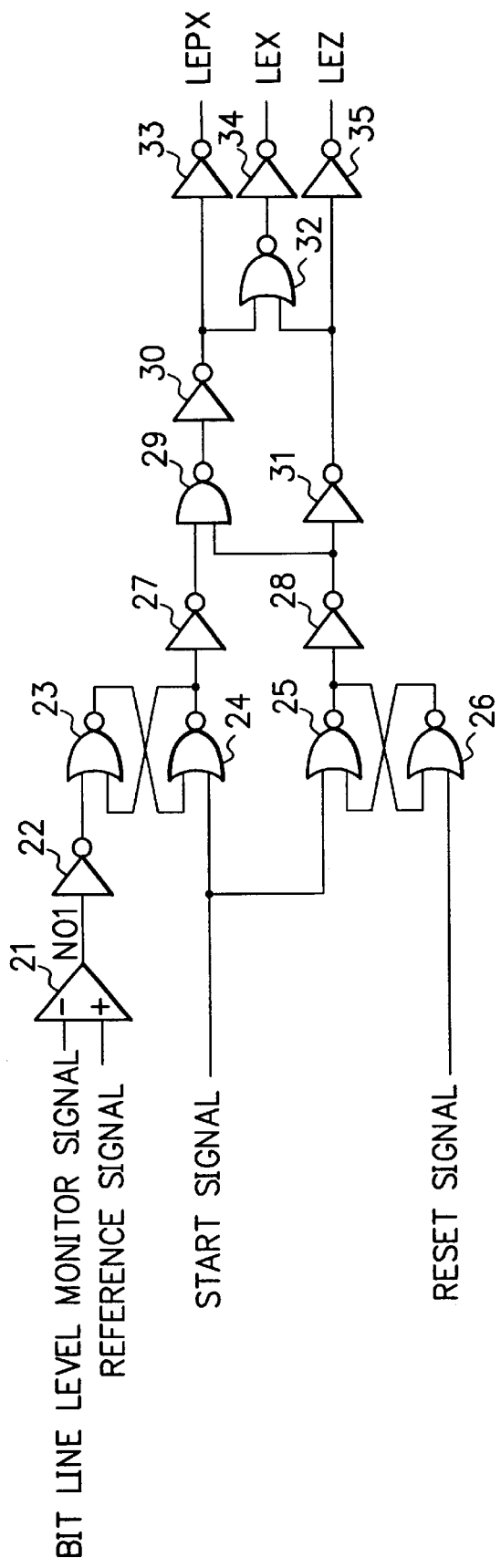
FIG. 3 is a circuit diagram showing the arrangement of a sense amplifier driver control circuit shown in FIG. 2.
Figure 4:
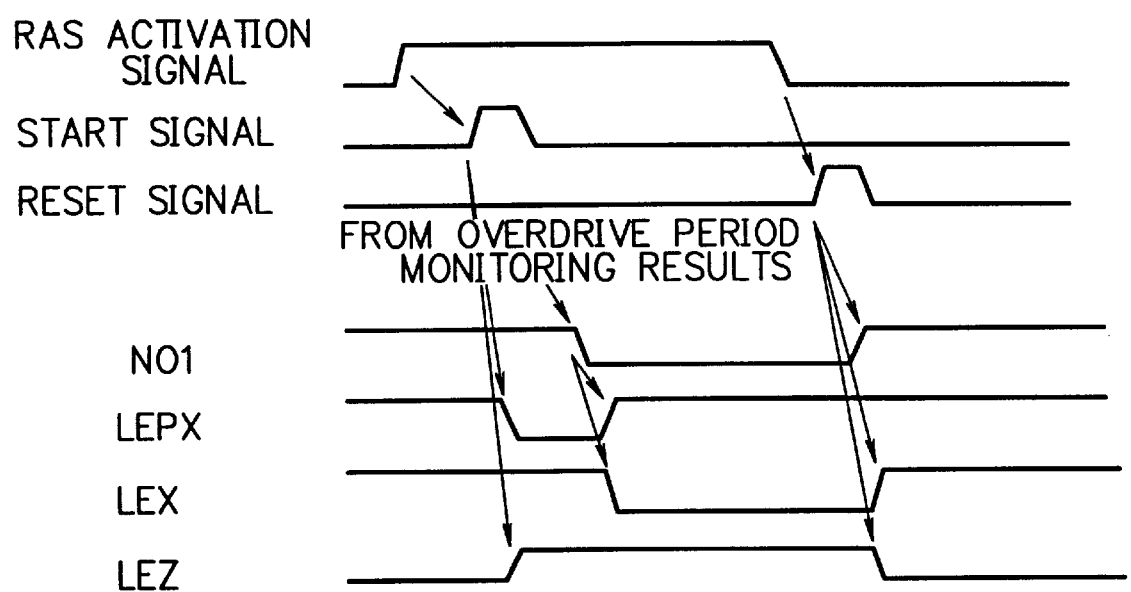
FIG. 4 is a timing chart for explaining the operation of the sense amplifier driver control circuit shown in FIG. 2.

FIG. 3 is a diagrammatic view showing the arrangement of the sense amplifier driver control circuit 10 shown in FIG. 2. FIG. 4 is a timing chart for explaining the operation of the circuit 10.

When an active command such as read or write is input to the semiconductor memory of this embodiment, an RAS (Row Address Strobe) activation signal rises as shown in FIG. 4.

When this RAS activation signal rises, as explained in FIG. 2, a word line WL connected to a memory cell 1 to be accessed is selected, and the electric charge of this memory cell 1 is read out onto a pair of bit lines BL and /BL. After that, a start signal (a pulse signal generated in accordance with the RAS activation signal) for driving the sense amplifiers $4_{-1}$ to $4_{-n}$ is output.

When the start signal rises to "H", the driving signal LEPX falls to "L" via a NOR gate 24, an inverter 27, a NAND gate 29, and inverters 30 and 33 in the sense amplifier driver control circuit 10 shown in FIG. 3, and the driving signal LEZ rises to "H" via NOR gates 25 and 26 and inverters 28, 31, and 35. The driving signal LEX changes to "H" since the two signals passing through the inverters 30 and 31 are output via a NOR gate 32 and an inverter 34. Consequently, the p-MOS transistor 11 and the n-MOS transistor 13 shown in FIG. 2 are turned on to start the restore operation of the memory cell 1.

The period of overdriving using this p-type MOS transistor 11 is until the voltage level generated on the bit lines BL and /BL reaches the level of the internal step-down voltage VII. That is, the voltage level on the bit lines BL and /BL is monitored in a certain sense amplifier, and the monitor signal is input to one input terminal of a comparator 21 in the sense amplifier driver control circuit 10. A reference signal corresponding to the internal step-down voltage VII is input to the other input terminal of the comparator 21. When the voltage of the bit line level monitor signal reaches the voltage VII of the reference signal, the comparator 21 outputs a signal of level "L".

When the voltage of an output node NO1 of the comparator 21 changes to "L", the driving signal LEPX rises to "H" via the inverter 22, the NOR gates 23 and 24, the inverter 27, the NAND gate 29, and the inverters 30 and 33. Consequently, the p-type MOS transistor 11 shown in FIG. 2 is turned off to stop the overdriving.

At the same time, a signal input from the inverter 30 to the NOR gate 32 changes from "H" to "L", so the driving signal LEX output via this NOR gate 32 and the inverter 34 falls to "L". Accordingly, the p-type MOS transistor 12 shown in FIG. 2 is turned on to clamp the bit lines BL and /BL, restored at the level of the internal step-down voltage VII, to the level of the internal step-down voltage VII.

In general, the driving capability of a p-type MOS transistor is inferior to that of an n-type MOS transistor. Hence, the overdriving method is used only on the charging side. Therefore, the driving signal LEZ for driving the n-type MOS transistor 13 maintains level "H" during the period in which the sense amplifier is kept activated as shown in FIG. 4. To precharge the voltage level of the bit lines BL and /BL, a reset signal changes to "H" in accordance with the trailing edge of the RAS activation signal, and the sense amplifier is reset by changing the driving signals LEX and LEZ to "H" and "L", respectively.

In the above embodiment, the voltage level of a pair of bit lines BL and /BL is monitored by using a sense amplifier actually used in the storage area of a memory. However, it is also possible to prepare a dummy sense amplifier dedicated to monitoring and monitor the voltage level of a pair of bit lines BL and /BL by using this dummy sense amplifier.

Figure 5A:
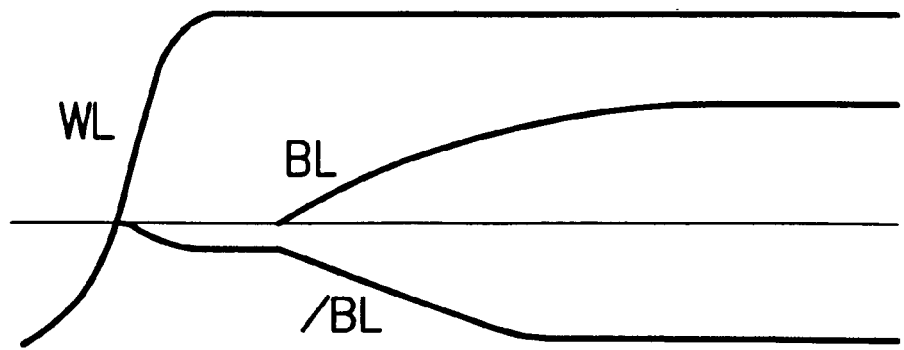
Figure 5B:
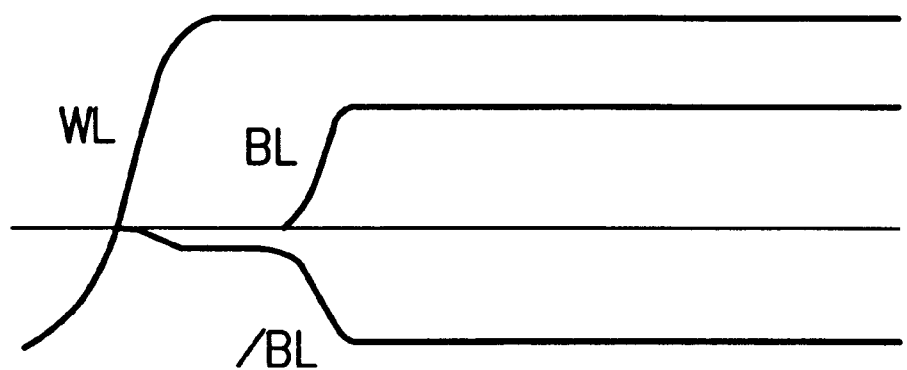

FIGS. 5A and 5B are charts showing operating waveforms during restore operation. FIG. 5A shows operating waveforms in the conventional overdriving method. FIG. 5B shows operating waveforms when the p-type MOS transistors 11 dispersed in one-to-one correspondence with the sense amplifiers $4_{-1}$ to $4_{-n}$ as in this embodiment are driven by the overdriving method. As is apparent from FIGS. 5A and 5B, this embodiment can greatly shorten the time required for the voltage on a pair of bit lines BL and /BL to reach a predetermined level and to shorten remarkably the restore time in comparison with the conventional method.

Figure 6:
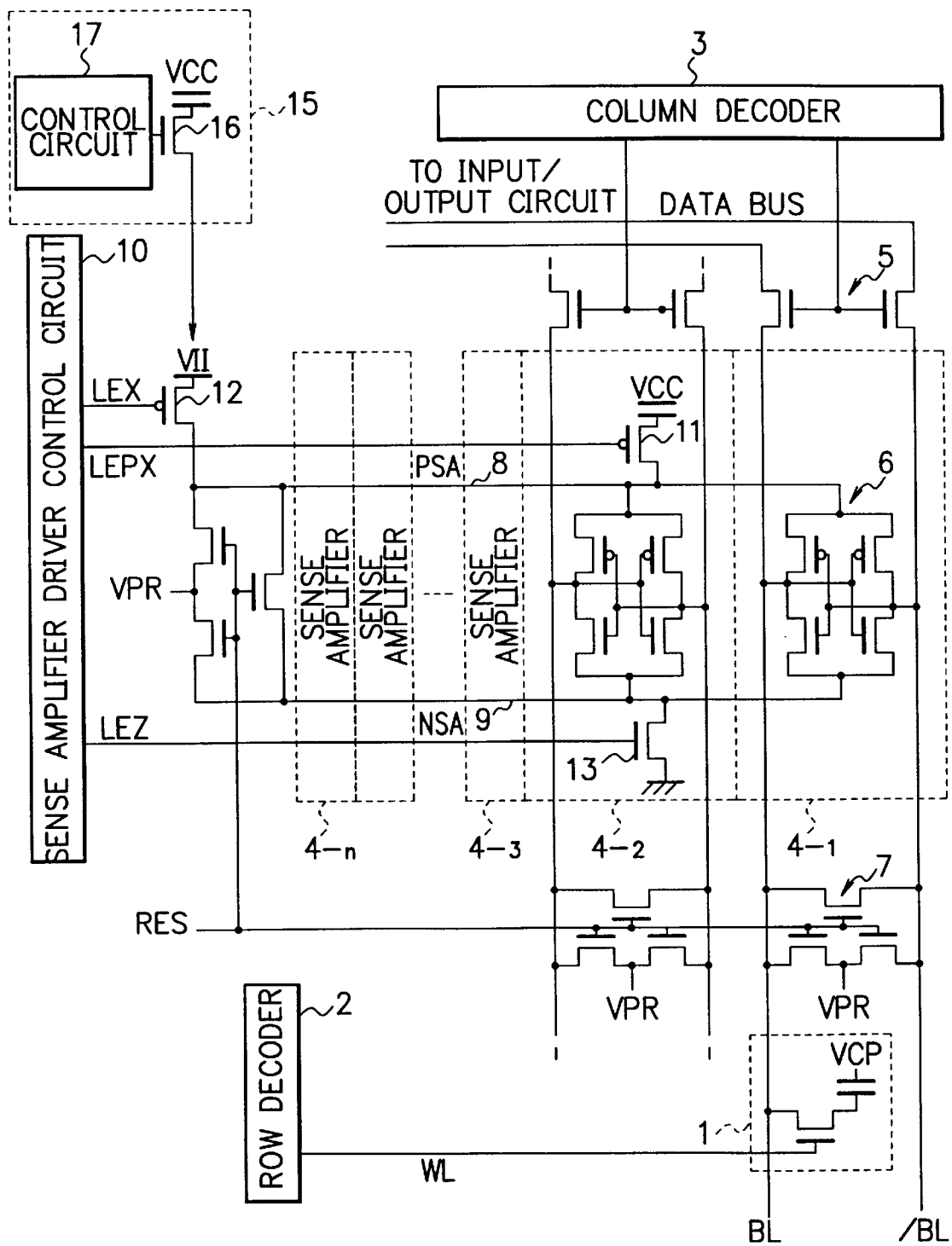
FIG. 6 is a circuit diagram showing a partial configuration of a semiconductor memory according to the second embodiment of the present invention.

The second embodiment of the present invention will be described next. FIG. 6 is a diagrammatic view showing a partial configuration of a semiconductor memory according to this second embodiment. The same reference numerals as in FIG. 2 denote the same parts as in FIG. 6, and a detailed description thereof will be omitted.

In this embodiment, as shown in FIG. 6, sense amplifiers $4_{-1}$ to $4_{-n}$ are grouped in pairs, and a p-type MOS transistor 11, which is a sense amplifier driver for driving a flip-flop 6, and an n-type MOS transistor 13 are provided for each group. For example, two sense amplifiers $4_{-1}$ and $4_{-2}$ constitute one group, and one p-type MOS transistor 11 and one n-type MOS transistor 13 are provided for this group. Also, another p-type MOS transistor 11 and another n-type MOS transistor 13 (not shown) are provided for sense amplifiers $4_{-3}$ and $4_{-4}$. The rest of the arrangement and operation is the same as in the first embodiment shown in FIG. 2.

In this second embodiment, the driving capability per sense amplifier of the p-type MOS transistor 11 is somewhat less than that in the first embodiment shown in FIG. 2 but much greater than that in conventional memories, so the speed of restore operation can be increased. In addition, since the total number of transistors can be decreased to half that of the first embodiment, an increase in the chip area can be suppressed.

In FIG. 6, one group is constituted by two sense amplifiers. However, the present invention is not limited to this arrangement. That is, one group can include a larger number of sense amplifiers (except for all sense amplifiers $4_{-1}$ to $4_{-n}$). The number of sense amplifiers constituting one group can be appropriately determined by tradeoff between the restore time and the chip area.

The third embodiment of the present invention will be described next. FIG. 7 is a diagrammatic view showing a partial configuration of a semiconductor memory according to this third embodiment. The same reference numerals as in FIG. 2 denote the same parts as in FIG. 7, and a detailed description thereof will be omitted.

Figure 8:
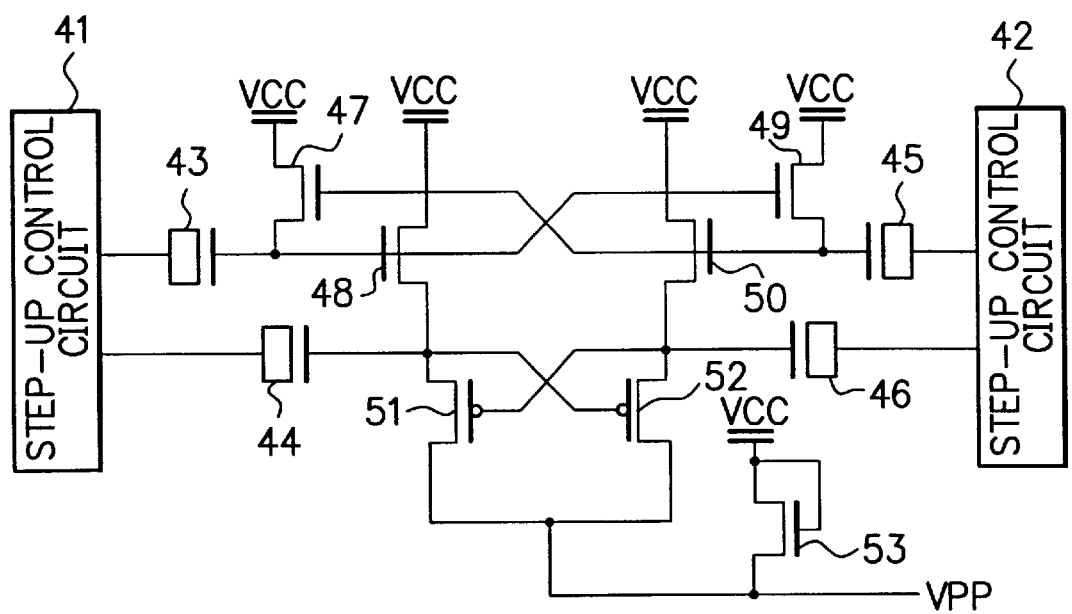
FIG. 8 is a circuit diagram showing the arrangement of a step-up circuit used in the third embodiment.

In this embodiment, as shown in FIG. 7, a p-type MOS transistor 11 is connected between a signal line 8 and the power supply of an internal step-up voltage VPP. A p-type MOS transistor 12 is connected between the signal line 8 and the power supply of an external voltage VCC. The internal step-up voltage VPP is generated from the external voltage VCC by a step-up circuit as shown in FIG. 8. The rest of the arrangement and operation is the same as in the first embodiment shown in FIG. 2.

As shown in FIG. 8, the internal step-up circuit includes step-up control circuits 41 and 42, MOS capacitors 43 to 46 connected to these step-up control circuits 41 and 42, n-type MOS transistors 47 to 50 connected between these MOS capacitors 43 to 46 and the power supply of the external voltage VCC, p-type MOS transistors 51 and 52 connected to the drains of the n-type MOS transistors 48 and 50, respectively, and an n-type MOS transistor 53 connected between the common drain of the p-type MOS transistors 51 and 52 and the power supply of the external voltage VCC.

In the step-up circuit constructed as above, the step-up control circuits 41 and 42 supply clock signals to the MOS capacitors 43 to 46 to drive these MOS capacitors 43 to 46. The VPP power line is held at the step-up potential by alternately performing: (1) charging of the external voltage VCC to the MOS capacitor 46 and supply of electric charge from the MOS capacitor 44 to the VPP power line; and (2) supply of electric charge from the MOS capacitor 46 to the VPP power line and charging of the external voltage VCC to the MOS capacitor 44. This step-up voltage VPP is supplied to the p-type MOS transistor 11 shown in FIG. 7.

According to the third embodiment, restore operation can be performed at higher speed as in the first embodiment. In addition, the third embodiment can cope with use of the external voltage VCC as a memory stored voltage.

Each embodiment described above is only for one practical example in embodying the present invention. So, the technical scope of the present invention should not be limitedly interpreted by these embodiments. That is, the present invention can be embodied in various forms without departing from its spirit and principal characteristic features.

For example, in the above embodiments, overdriving is used only for p-type MOS transistors, but overdriving can also be used for n-type MOS transistors.

Also, in the first and third embodiments, each sense amplifier is provided with one n-type MOS transistor 13. However, each group of sense amplifiers may be provided with one MOS transistor 13, or all sense amplifiers $4_{-1}$ to $4_{-n}$ may be provided with one MOS transistor 13 in common.

In the second embodiment, the number of the n-type MOS transistors 13 for the sense amplifiers $4_{-1}$ to $4_{-n}$ can be smaller than the number of the p-type MOS transistors 11. Alternatively, one n-type MOS transistor 13 can be shared by all sense amplifiers $4_{-1}$ to $4_{-n}$.

Furthermore, the semiconductor memory of each embodiment is applicable to a DRAM other than an FCRAM.

What is claimed is:

1. A semiconductor memory having sense amplifiers for receiving data of memory cells corresponding to a selected word line via bit lines and amplifying the received data, said memory comprising:
    a plurality of first sense amplifier driving circuits each provided for one of said sense amplifiers for supplying a first power-supply voltage to said sense amplifiers to activate the sense amplifiers; and
    a second sense amplifier driving circuit shared by said sense amplifiers for supplying a second power-supply voltage to said sense amplifiers to activate the sense amplifiers and wherein said first power-supply voltage is different from said second power-supply voltage.

2. The semiconductor memory according to claim 1, wherein said first power-supply voltage is higher than said second power-supply voltage.

3. The semiconductor memory according to claim 1, wherein said first power-supply voltage is an external voltage, and said second power-supply voltage is a step-down voltage of said external voltage.

4. The semiconductor memory according to claim 3, further comprising a step-down circuit for stepping down said first power-supply voltage to generate said second power-supply voltage.

5. The semiconductor memory according to claim 1, further comprising a sense amplifier driving control circuit for activating said first sense amplifier driving circuits, then activating said second sense amplifier driving circuit.

6. The semiconductor memory according to claim 5, wherein a period during which said first sense amplifier driving circuits drives sense amplifiers is changed in accordance with parasitic capacitance and parasitic resistance of said bit lines.

7. The semiconductor memory according to claim 1, wherein said second power-supply voltage is an external voltage, and said first power-supply voltage is a step-up voltage of said external voltage.

8. The semiconductor memory according to claim 7, further comprising a step-up circuit for stepping up said second power-supply voltage to generate said first power-supply voltage.

9. A semiconductor memory having sense amplifiers, which comprises a plurality of groups, for receiving data of memory cells corresponding to a selected word line via bit lines and amplifying the received data, said memory comprising:
    a plurality of first sense amplifier driving circuits each provided for one of said groups, for supplying a first power-supply voltage to said sense amplifiers to activate the sense amplifiers; and
    a second sense amplifier driving circuit shared by said sense amplifiers for supplying a second power-supply voltage to said sense amplifiers to activate the sense amplifiers and wherein said first power-supply voltage is different from said second power-supply voltage.

10. The semiconductor memory according to claim 9, wherein said first power-supply voltage is higher than said second power-supply voltage.

11. The semiconductor memory according to claim 9, wherein said first power-supply voltage is an external voltage, and said second power-supply voltage is a step-down voltage of said external voltage.

12. The semiconductor memory according to claim 11, further comprising a step-down circuit for stepping down said first power-supply voltage to generate said second power-supply voltage.

13. The semiconductor memory according to claim 9, further comprising a sense amplifier driving control circuit for activating said first sense amplifier driving circuits, then activating said second sense amplifier driving circuit.

14. The semiconductor memory according to claim 13, wherein a period during which said first sense amplifier driving circuits drives sense amplifiers is changed in accordance with parasitic capacitance and parasitic resistance of said bit lines.

15. The semiconductor memory according to claim 9, wherein each of said groups of said sense amplifiers includes a plurality of additional sense amplifiers.

16. The semiconductor memory according to claim 9, wherein said second power-supply voltage is an external voltage, and said first power-supply voltage is a step-up voltage of said external voltage.

17. The semiconductor memory according to claim 16, further comprising a step-up circuit for stepping up said second power-supply voltage to generate said first power-supply voltage.

* * * * *